US006898774B2

(12) United States Patent
Alpert et al.

(10) Patent No.: US 6,898,774 B2
(45) Date of Patent: May 24, 2005

(54) BUFFER INSERTION WITH ADAPTIVE BLOCKAGE AVOIDANCE

(75) Inventors: Charles Jay Alpert, Round Rock, TX (US); Rama Gopal Gandham, Wappingers Falls, NY (US); Jiang Hu, College Station, TX (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/324,732

(22) Filed: Dec. 18, 2002

(65) Prior Publication Data

US 2004/0123261 A1 Jun. 24, 2004

(51) Int. Cl.[7] ............................................. G06F 17/50
(52) U.S. Cl. .............................. 716/13; 716/2; 716/12; 716/14
(58) Field of Search ............................... 716/2, 5, 6, 9, 716/12, 13, 14

(56) References Cited

U.S. PATENT DOCUMENTS

| | | | | | |
|---|---|---|---|---|---|
| 5,629,860 | A | * | 5/1997 | Jones et al. ...................... | 716/6 |
| 6,044,209 | A | * | 3/2000 | Alpert et al. ................... | 716/6 |
| 6,401,234 | B1 | * | 6/2002 | Alpert et al. .................. | 716/13 |
| 6,467,069 | B2 | * | 10/2002 | Mehrotra et al. ............... | 716/6 |
| 6,519,745 | B1 | * | 2/2003 | Srinivas et al. ................. | 716/5 |
| 6,557,145 | B2 | * | 4/2003 | Boyle et al. ..................... | 716/2 |
| 6,591,411 | B2 | * | 7/2003 | Alpert et al. .................. | 716/13 |
| 6,615,401 | B1 | * | 9/2003 | Gasanov et al. ............... | 716/12 |
| 6,622,291 | B1 | * | 9/2003 | Ginetti ........................... | 716/9 |
| 2003/0212976 | A1 | * | 11/2003 | Drumm ......................... | 716/12 |

OTHER PUBLICATIONS

Hrkic et al., "S–Tree: a technique for buffered routing tree synthesis", Jun. 10–14, 2002 Design Automation Conference, 2002. Proceedings. 39th , pp.: 578–583.*

Alpert et al., "Steiner tree optimization for buffers. Blockages and bays", May 6–9, 2001 Circuits and Systems, 2001. ISCAS 2001. The 2001 International Symposium on , vol.: 5 , pp.: 399–402 vol. 5.*

Alpert et al., "Wire Segmenting for Improved buffer insertion", Jun. 9–13, 1997, Design Automation Conference, 1997. Proceedings of the 34th, pp.: 588–593.*

Zhou et al., "Simultaneous Routing and Buffer Insertion with Restrictions on Buffer Location", IEEE Transaction on Computer Aided Design of Integrated Circuits and Systems, vol. 19, No. 7, Jul. 2000, pp. 819–824.

Van Ginneken, "Buffer Placement in Distributed RC–tree Networks for Minimal Elmore Delay", International Business Machines Corporation, Abstract, pp. 865–868.

Gupta et al., "The Elmore Delay as a Bound for RC Trees with Generalized Input Signals", IEEE Transactions on Computer–Aided Design of Integrated Circuits and Systems, vol. 16, No. 1, Jan. 1997, pp. 95–104.

Alpert et al., "Buffer Insertion with Accurate Gate and Interconnect Delay Computation", International Business Machines Corporation, Abstract, pp. 479–484.

Alpert et al., "Wire Segmenting for Improved Buffer Insertion", IBM Austin Research Laboratory, Austin, Texas, Abstract, Abstract, pp. 588–593.

Alpert et al., "Steiner Tree Optimization for Buffers, Blockages, and Bays", IEEE Transactions on Computer–Aided Design of Integrated Circuits and Systems, vol. 20, No. 4, Apr. 2001, pp. 556–562.

(Continued)

Primary Examiner—Vuthe Siek
(74) Attorney, Agent, or Firm—Duke W. Yee; Casimer K. Salys; Francis Lammes (57) ABSTRACT

A method, computer program product, and data processing system for inserting buffers into integrated circuit routing trees are disclosed. The present invention dynamically modifies a Steiner tree configuration as needed to derive a maximal slack solution that takes into account blockages such as those presented by IP blocks.

27 Claims, 9 Drawing Sheets

OTHER PUBLICATIONS

Cong et al., "Buffer Block Planning for Interconnect–Driven Floorplanning", Department of Computer Science, University of California, Los Angeles, CA, Abstract, pp. 358–363.

Alpert et al., "Buffer Insertion for Noise and Delay Optimization", International Business Machines Corporation, Abstract, pp. 362–367.

Cong et al., "Routing Tree Construction Under Fixed Buffer Locations", ACM Digital Library, 2000, pp. 379–384.

Tang et al., "A New Algorithm for Routing Tree Construction with Buffer Insertion and Wire Sizing Under Obstacle Constraints", University of Texas at Austin, Austin, TX, IEEE, 2001, pp. 49–56.

Lai et al., "Maze Routing with Buffer Insertion and Wiresizing", ACM Digital Library, 2000, pp. 374–378.

Jagannathan et al., "A Fast Algorithm for Context–Aware Buffer Insertion", ACM Digital Library, 2000, pp. 368–373.

Lillis et al., "Simultaneous Routing and Buffer Insertion for High Performance Interconnect", University of California, San Diego, La Jolla, CA, IEEE 1996, pp. 148–153.

Alpert et al., "Buffered Steiner Trees for Difficult Instances", IEEE Transactions on Computer–Aided Design of Integrated Circuits and Systems, vol. 21, No. 1, Jan. 2002, pp. 3–13.

Cormen et al., "Interval Trees", Introduction to Algorithms, MIT Press, 2001, pp. 311–316.

* cited by examiner

| Procedure: *FindCandidates(v)* |
|---|
| Input: Current node $v$ to be processed<br>Output: Candidate solution set $S(\widetilde{V}(v))$ at $\widetilde{V}(v)$<br>Global: Steiner tree $T(V,E)$<br>        Buffer library $B = \{b_1, b_2, ...\}$<br>        Rectangles $R = \{r_1, r_2, ...\}$ |
| 1. $\widetilde{V}(v) \leftarrow \{v\}$<br>2. If $v$ is a Steiner node in a blockage<br>    $\widetilde{V}(v) \leftarrow \widetilde{V}(v) \cup \textit{UnblockedNodes}(v,R)$<br>3. $S(\widetilde{V}(v)) \leftarrow \varnothing$<br>4. If $v$ is a sink<br>    $S(\widetilde{V}(v)) \leftarrow S(\widetilde{V}(v)) \cup \{(c(v), q(v))\}$<br>    Return $S(\widetilde{V}(v))$<br>5. $v_l \leftarrow$ left child node of $v$<br>    $S(\widetilde{V}(v_l)) \leftarrow \textit{FindCandidates}(v_l)$<br>6. $S_l(\widetilde{V}(v)) \leftarrow \textit{Propagate}(S(\widetilde{V}(v_l)), \widetilde{V}(v))$<br>7. If $v$ has only one child, Return $S_l(\widetilde{V}(v))$<br>8. $v_r \leftarrow$ right child node of $v$<br>    $S(\widetilde{V}(v_r)) \leftarrow \textit{FindCandidates}(v_r)$<br>9. $S_r(\widetilde{V}(v)) \leftarrow \textit{Propagate}(S(\widetilde{V}(v_r)), \widetilde{V}(v))$<br>10. $S(\widetilde{V}(v)) \leftarrow \textit{Merge}(S_l(\widetilde{V}(v)), S_r(\widetilde{V}(v)))$<br>11. Return $S(\widetilde{V}(v))$ |

FIG. 8

| Procedure: *Propagate* $(S(\widetilde{V}(v_i)), \widetilde{V}(v_j))$ |
|---|
| Input:   Candidate solutions at $S(\widetilde{V}(v_i))$<br>        Node set $\widetilde{V}(v_j)$<br>Output: Candidate solution set $S(\widetilde{V}(v_j))$ at $\widetilde{V}(v_j)$ |
| 0.  $S(\widetilde{V}(v_j)) \leftarrow 0$<br>1.  For each node $v_{i,k} \in \widetilde{V}(v_i)$<br>2.     For each node $v_{j,l} \in \widetilde{V}(v_j)$<br>3.        If $v_{i,k} \rightsquigarrow v_{j,l}$ is monotone or $v_{i,k} == v_i$<br>4.            P $\leftarrow$ *LeastBlockedPath* $(v_{i,k}, v_{j,l})$<br>5.            *DoSegmenting* (P)<br>6.            $v_p \leftarrow v_{i,k}$<br>7.            While $v_q \leftarrow$ node next to $v_p$ in P<br>                  $S(v_q) \leftarrow$ *AddBuffer* (*Grow*$(S(v_p), v_q)$)<br>                  $v_p \leftarrow v_q$<br>8.            $S(\widetilde{V}(v_j)) \leftarrow S(\widetilde{V}(v_j)) \cup S(v_p)$<br>9.  For each node $v_{j,l} \in \widetilde{V}(v_j)$<br>      *PruneSolutions* $(S(v_{j,l}))$<br>10. Return $S(\widetilde{V}(v_j))$ |

FIG. 9

BUFFER INSERTION WITH ADAPTIVE BLOCKAGE AVOIDANCE

BACKGROUND OF THE INVENTION

1. Technical Field

The present invention relates generally to the automated layout of integrated circuits. In particular, the present invention is directed toward automatic, optimized insertion of buffers into integrated circuit routing trees.

2. Description of Related Art

In recent years, it has become commonplace for integrated circuit designers to build an integrated circuit layout from libraries of reusable high-level modules, sometimes referred to as "macro blocks." Proprietary macro blocks are often referred to as "intellectual property blocks" ("IP blocks"), to emphasize their relatively intangible, yet proprietary nature. Computerized integrated circuit design tools may be used to store, retrieve, and combine macro blocks into complete integrated circuits. This design philosophy of combining reusable macro blocks to produce a complex integrated circuit is known as "system-on-a-chip" (SoC) design. Designing a "system-on-a-chip" involves designing the interconnections between macro blocks. Despite the apparent simplicity of SoC design, this is often not a trivial task. The reason for this is that the connections themselves are physical components (i.e., wires) with non-ideal properties. Like all electrical conductors, integrated circuit connections suffer from delay and signal loss due to physical properties such as resistance, capacitance, and relativistic limitations on the speed at which electrons are able to travel. In order to ensure that all components in an integrated circuit are properly synchronized to work properly, it is important to take these factors into account when designing interconnections between macro blocks to minimize signal loss and to allow operation within acceptable timing specifications.

Buffer insertion is now widely recognized as a key technology for improving VLSI (Very Large Scale Integration) interconnect performance. For a buffer insertion technique to be effective, however, it must be fully aware of its surrounding blockage constraints while also being efficient enough to quickly process thousands of nets. In the buffer insertion literature, van Ginneken's dynamic programming based algorithm has established itself as a classic in the field. Van Ginneken's algorithm is described in L. P. P. van Ginneken, "Buffer placement in distributed RC-tree networks for minimal Elmore delay," *Proceedings of the IEEE International Symposium on Circuits and Systems*, pp. 865–868, 1990, which is hereby incorporated by reference. Van Ginneken's algorithm assumes a Steiner tree routing topology and inserts buffers into the Steiner tree so as to minimize Elmore delay. A Steiner tree is defined as follows: If, in a weighted graph, a subset of the vertices are designated as "terminals," a Steiner tree is a minimum-weight connected subgraph which includes all of the "terminals." Thus, for example, a minimum spanning tree of a graph is a special case of a Steiner tree in which all of the vertices in the graph are selected as terminals.

Figure 1A:
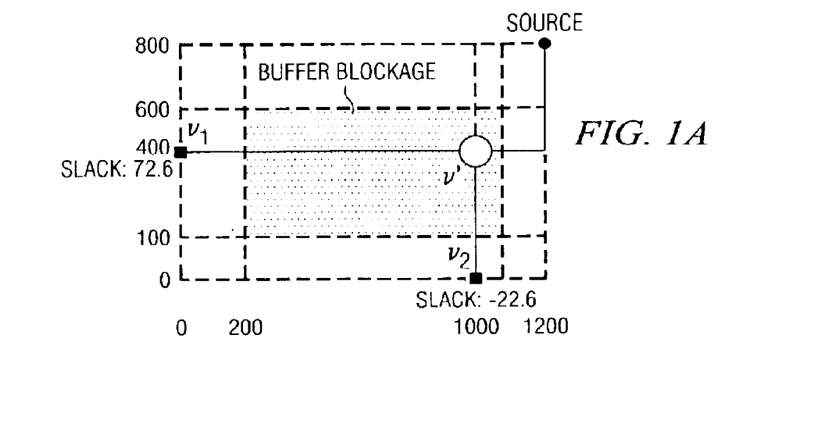
FIGS. 1A–1F are diagrams describing a number of solutions to the buffer insertion problem in a Steiner tree with a Steiner node overlapping a blockage.
Figure 1B:
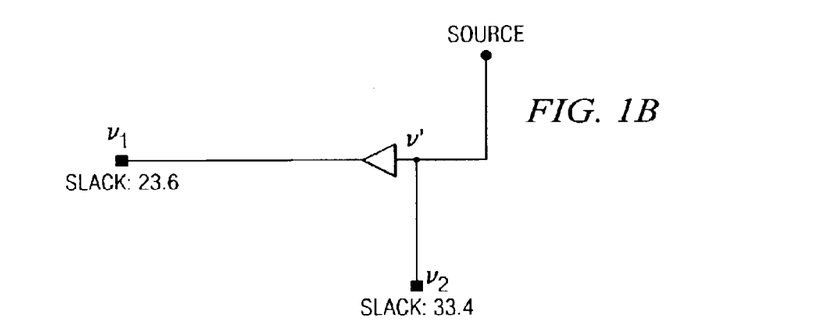
Figure 1C:
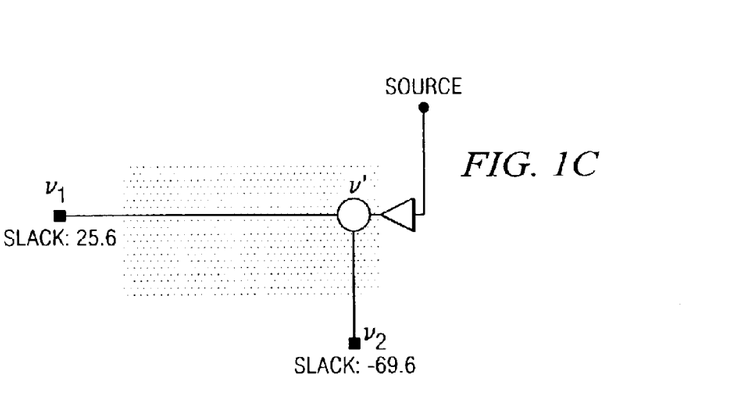
Figure 1D:
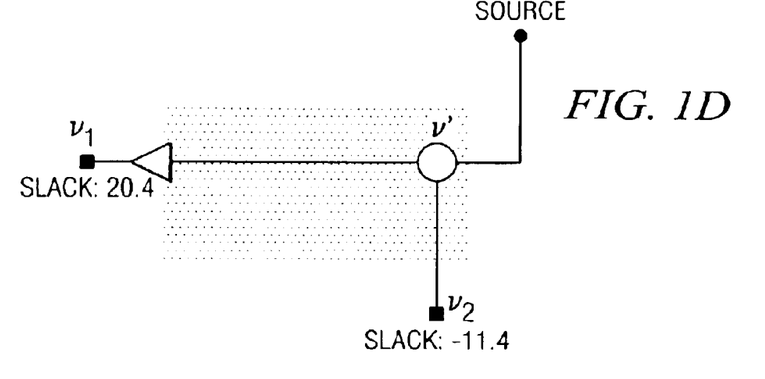

Prior to buffer insertion, several large area chunks may be already occupied by macro or IP blocks for which wires can be routed over the blocks, but buffers cannot be inserted inside the blocks. We call these regions "buffer blockages." For example, FIG. 1A shows a Steiner tree with 3-pins and a buffer blockage. Let the required arrival times for the sinks be rat($v_1$)=200 and rat($v_2$)=100. If the blockage is ignored, one can obtain a good solution as shown in FIG. 1B. Here the buffer acts to decouple the load from the $v_1$ branch to the more critical sink $v_2$. Of course, in practice, one cannot ignore the buffer blockage and a solution other than that in FIG. 1B must be sought. If one restricts the solution space to the existing Steiner topology, the two best solutions are shown in FIGS. 1C and 1D, but neither solution meets the required timing constraints (i.e., the amount of timing slack allowed is negative, meaning that the timing constraints will be exceeded; a positive slack denotes a solution that fits within specified timing constraints).

A number of papers, including H. Zhou, D. F. Wong, I-M. Liu, and A. Aziz, "Simultaneous routing and buffer insertion with restrictions on buffer locations," *Proceedings of the ACM/IEEE Design Automation Conference*, pp. 96–99, 1999; A. Jagannathan, S.-W. Hur, and J. Lillis, "A fast algorithm for context-aware buffer insertion," *Proceedings of the ACM/IEEE Design Automation Conference*, pp. 368–373, 2000; and M. Lai and D. F. Wong, "Maze routing with buffer insertion and wiresizing," *Proceedings of the ACM/IEEE Design Automation ACM/IEEE Design Automation Conference*, pp. 374–378, 2000, propose optimal algorithms for finding a minimum delay buffered path with buffer blockages. In J. Cong and X. Yuan, "Routing tree construction under fixed buffer locations," *Proceedings of the ACM/IEEE Design Automation Conference*, pp. 379–384, 2000, Cong and Yuan proposed a dynamic programming algorithm, called RMP, to handle the multi-sink net buffer insertion with location restrictions. RMP is designed for the buffer block methodology for which the number of legal buffer locations is quite limited. The buffer block methodology is described in J. Cong, T. Kong, and D. Z. Pan, "Buffer block planning for interconnect-driven floorplanning," *Proceedings of the IEEE/ACM International Conference on Computer-Aided Design*, pp. 358–363, 1999. RMP works on a grid graph that is constructed by adding horizontal and vertical lines through each potential buffer locations to the Hanan grid. It not only explores almost every node on the grid in tree construction but also considers many sink combinations in subsolutions. Consequently, RMP tends to be slow when either the number of net pins or legal buffer locations is large. Nevertheless, RMP generally yields near optimal solutions in term of timing performance. More recently, Tang et al. suggested a graph-based algorithm on a similar problem in X. Tang, R. Tian, H. Xiang, and D. F. Wong, "A new algorithm for routing tree construction with buffer insertion and wire sizing under obstacle constraints," *Proceedings of the IEEE/ACM International Conference on Computer-Aided Design*, pp. 49–56, 2001. While more efficient than RMP, it can optimize only the maximum sink delay rather than the minimum slack.

Figure 1E:
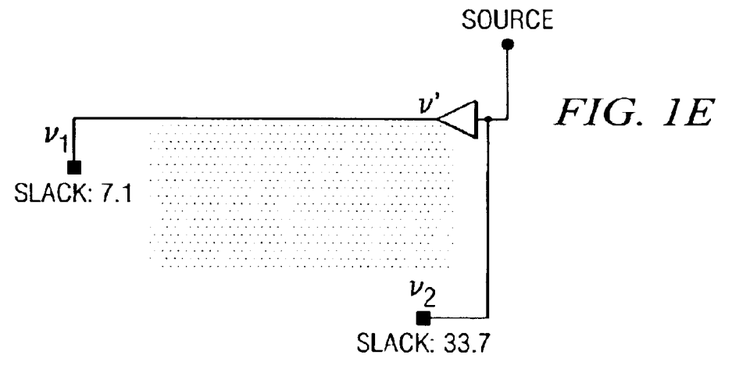
Figure 1F:
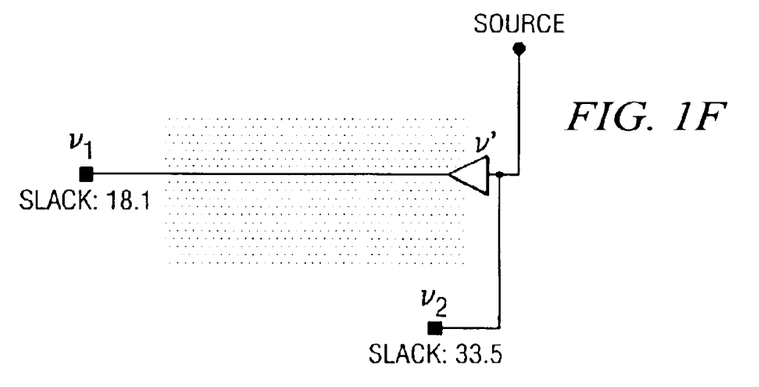

Difficult buffering problems occur not just with large nets but also when sink polarity constraints are present. Alpert et al. developed the "buffer-aware" C-Tree heuristic to be used as a precursor to van Ginneken's algorithm. The C-Tree heuristic is described in C. J. Alpert, G. Gandham, M. Hrkic, J. Hu, A. B. Kahng, J. Lillis, B. Liu, S. T. Quay, S. S. Saptnekar, and A. J. Sullivan, "Buffered Steiner Trees for Difficult Instances," *IEEE Transactions on Computer-Aided Design*, vol. 21, no. 1, January 2002, pp. 3–14, which is hereby incorporated by reference. The C-Tree method is not "blockage-aware," however. To solve this problem, one could first run C-Tree, then invoke the algorithm of C. J. Alpert, G. Gandham, J. Hu, J. L. Neves, S. T. Quay, and S. S. Sapatnekar, "Steiner Tree Optimization for Buffers, Blockages, and Bays," *IEEE Transactions on Computer-Aided Design*, vol. 20, no. 4, April 2001, pp. 556–562, hereby incorporated by reference, which performs local re-routing to avoid the blockages without adding too much wiring. Then, one could pass this modified tree to van Ginneken's buffer insertion algorithm. For example, this approach would obtain the buffered solution in FIG. 1E. However, a carefully constructed timing-driven topology can be destroyed by these local topology changes, making the final slack worse than not running local rerouting at all.

Thus, a need exists for a fast and effective technique for performing optimal buffer insertion on multi-sink nets.

SUMMARY OF THE INVENTION

The present invention is directed toward a method, computer program product, and data processing system for inserting buffers into integrated circuit routing trees. The present invention dynamically modifies a Steiner tree configuration as needed to derive a maximal slack solution that takes into account blockages such as those presented by IP blocks.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 2:
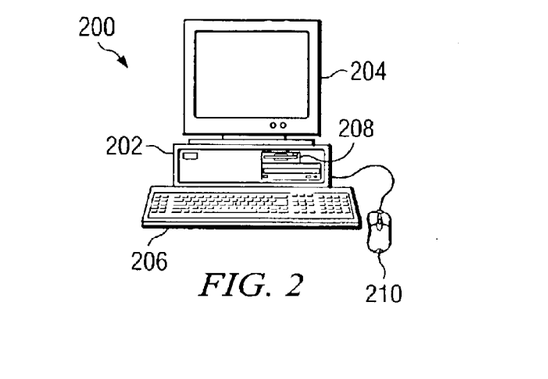
FIG. 2 is a diagram providing an external view of a data processing system in which the present invention may be implemented.

With reference now to the figures and in particular with reference to FIG. 2, a pictorial representation of a data processing system in which the present invention may be implemented is depicted in accordance with a preferred embodiment of the present invention. A computer 200 is depicted which includes system unit 202, video display terminal 204, keyboard 206, storage devices 208, which may include floppy drives and other types of permanent and removable storage media, and mouse 210. Additional input devices may be included with personal computer 200, such as, for example, a joystick, touchpad, touch screen, trackball, microphone, and the like. Computer 200 can be implemented using any suitable computer, such as an IBM eServer computer or IntelliStation computer, which are products of International Business Machines Corporation, located in Armonk, N.Y. Although the depicted representation shows a computer, other embodiments of the present invention may be implemented in other types of data processing systems, such as a network computer. Computer 200 also preferably includes a graphical user interface (GUI) that may be implemented by means of systems software residing in computer readable media in operation within computer 200.

Figure 3:
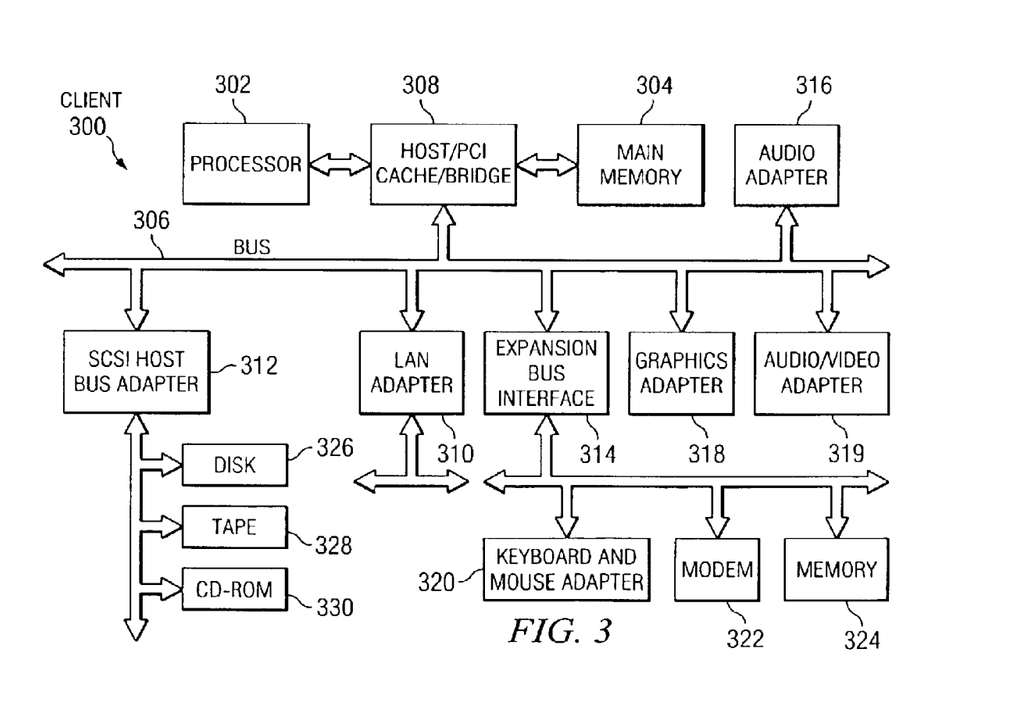
FIG. 3 is a block diagram of a data processing system in which the present invention may be implemented.

With reference now to FIG. 3, a block diagram of a data processing system is shown in which the present invention may be implemented. Data processing system 300 is an example of a computer, such as computer 200 in FIG. 2, in which code or instructions implementing the processes of the present invention may be located. Data processing system 300 employs a peripheral component interconnect (PCI) local bus architecture. Although the depicted example employs a PCI bus, other bus architectures such as Accelerated Graphics Port (AGP) and Industry Standard Architecture (ISA) may be used. Processor 302 and main memory 304 are connected to PCI local bus 306 through PCI bridge 308. PCI bridge 308 also may include an integrated memory controller and cache memory for processor 302. Additional connections to PCI local bus 306 may be made through direct component interconnection or through add-in boards. In the depicted example, local area network (LAN) adapter 310, small computer system interface SCSI host bus adapter 312, and expansion bus interface 314 are connected to PCI local bus 306 by direct component connection. In contrast, audio adapter 316, graphics adapter 318, and audio/video adapter 319 are connected to PCI local bus 306 by add-in boards inserted into expansion slots. Expansion bus interface 314 provides a connection for a keyboard and mouse adapter 320, modem 322, and additional memory 324. SCSI host bus adapter 312 provides a connection for hard disk drive 326, tape drive 328, and CD-ROM drive 330. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system such as Windows XP, which is available from Microsoft Corporation. An object oriented programming system such as Java may run in conjunction with the operating system and provides calls to the operating system from Java programs or applications executing on data processing system 300. "Java" is a trademark of Sun Microsystems, Inc. Instructions for the operating system, the object-oriented programming system, and applications or programs are located on storage devices, such as hard disk drive 326, and may be loaded into main memory 304 for execution by processor 302.

Those of ordinary skill in the art will appreciate that the hardware in FIG. 3 may vary depending on the implementation. Other internal hardware or peripheral devices, such as flash read-only memory (ROM), equivalent nonvolatile memory, or optical disk drives and the like, may be used in addition to or in place of the hardware depicted in FIG. 3. Also, the processes of the present invention may be applied to a multiprocessor data processing system.

For example, data processing system 300, if optionally configured as a network computer, may not include SCSI host bus adapter 312, hard disk drive 326, tape drive 328, and CD-ROM 330. In that case, the computer, to be properly called a client computer, includes some type of network communication interface, such as LAN adapter 310, modem 322, or the like. As another example, data processing system 300 may be a stand-alone system configured to be bootable without relying on some type of network communication interface, whether or not data processing system 300 comprises some type of network communication interface. As a further example, data processing system 300 may be a personal digital assistant (PDA), which is configured with ROM and/or flash ROM to provide non-volatile memory for storing operating system files and/or user-generated data.

The depicted example in FIG. 3 and above-described examples are not meant to imply architectural limitations. For example, data processing system 300 also may be a notebook computer or hand held computer in addition to taking the form of a PDA. Data processing system 300 also may be a kiosk or a Web appliance. The processes of the present invention are performed by processor 302 using computer implemented instructions, which may be located in a memory such as, for example, main memory 304, memory 324, or in one or more peripheral devices 326–330.

The present invention is directed toward a method, computer program product, and data processing system for inserting buffers into integrated circuit routing trees. The present invention dynamically modifies a Steiner tree configuration as needed to derive a maximal slack solution that takes into account blockages such as those presented by IP blocks.

Formal Problem Definition

For the Steiner tree construction, let $V_{internal}$ represent the set of nodes in the tree other than the source and sinks. The problem we address is formulated as follows:

Problem formulation: Given a net $N=\{v_0, v_1, v_2, \ldots, v_n\}$ with source $v_0$, sinks $v_1, \ldots, v_n$, load capacitances $c(v_i)$ and required arrival time $q(v_i)$ for each sink $v_i \in N$, a set of rectangles $R=\{r_1, r_2, \ldots r_k\}$ representing buffer blockages, and a buffer library $B=\{b_1, b_2, \ldots b_m\}$, find a buffered Steiner tree $T(V, E)$ where $V=N \cup V_{internal}$ and E spans every node in v such that the required arrival time at the source is maximized.

We adopt the Elmore delay model for interconnect and an RC switch model for gate delays. The Elmore delay metric is described in R. Gupta, B. Tutuianu, and L. T. Pileggi, "The Elmore Delay as a Bound for RC Trees with Generalized Input Signals," *IEEE Transactions on Computer Aided Design of Integrated Circuits and Systems*, vol. 16, no. 1, pp. 95–104, January 1997, which is hereby incorporated by reference. We assume that the given a routing tree T(V,E) is a binary tree, i.e., every internal node has no more than two children and that every sink has degree one. Any routing tree can be easily transformed to satisfy both conditions by inserting zero-length edges (i.e., pseudo-edges). Note that the choice of which sub-trees to group together can have an effect on solution quality. Grouping the subtrees together in a non-optimal way generally has limited effect on timing quality, but may waste buffers that have to be inserted for decoupling. Our implementation arbitrarily groups the child nodes.

Since a preferred embodiment of the present invention extends van Ginneken's algorithm to directly handle buffer blockages, we first overview the algorithm to form a basis for the remainder of this detailed description of the preferred embodiment. Van Ginneken's algorithm proceeds bottom-up from the leaf nodes along a given tree topology toward the source node. A set of candidate solutions is computed for each node during this process. A candidate solution at a node $v$ is characterized by the load capacitance $c(v)$ seen downstream and the required arrival time $q(v)$ at node $v$. We use a pair $s=(c(v),q(v))$ to specify a buffering solution at $v$. For any two candidate solutions $s_1=(c_1(v),q_1(v))$ and $s_2=(c_2(v), q_2(v))$, $s_1$ is dominated by (inferior to) $s_2$ if $c_1(v) \geq c_2(v)$ and $q_1(v) \leq q_2(v)$. A candidate solution set $S(v)=\{s_1, s_2, \ldots \}$ is a non-dominating set if no solution in this set is dominated by any other solution in this set. During the bottom-up process of van Ginneken's algorithm, the candidate solutions at leaf node evolve through the following operations:

Grow(S(v),w): propagate candidate set S(v) from node v to node w to get S(w). If the wire between v and w has resistance of R and capacitance C, we can get $c_i(w)=c_i(v)+C$ and $q_i(w)=q_i(v)-R(C/2+c_i(v))$ for each $(c_i(v), q_i(v)) \in S(v)$, and obtain S(w) from the solution pairs $(c_i(w),q_i(w)) \forall i$.

AddBuffer(S(v)): insert buffer at v and add the new candidate into S(v). If a buffer b has an input capacitance $c_b$, output resistance $r_b$ and intrinsic delay $t_b$, we can obtain $c_{i,buf}(v)=c_b$ and $q_{i,buf}(v)=q_i(v)-r_bc_i(v)-t_b$ for each $(c_i(v); q_i(v)) \in S(v)$ and add the pair $(c_{i,buf}(v), q_{i,buf}(v)) \forall i$ with the maximum $q_{i,buf}$ into S(v)

Merge($S_l(v)$, $S_r(v)$): merge solution set from left child of v to the solution set from the right child of v to obtain a merged solution set S(v). For a solution $(c_{j,left}(v),q_{j,left}(v))$ from the left child and a solution $(c_{k,right}(v), q_{k,right}(v))$ from the right child, the merged solution $(c_i(v),q_i(v))$ is obtained through letting $c_i(v)=c_{j,left}(v)+c_{k,right}(v)$ and $q_i(v)=\min(q_{j,left}(v), q_{k,right}(v))$.

PruneSolutions(S(v)): remove any solution $s_1 \in S(v)$ that is dominated by any other solution $s_2 \in S(v)$.

After a set of candidate solutions are propagated to the source, the solution with the maximum required arrival time is selected for the final solution. For a fixed routing tree, van Ginneken's algorithm can find the optimal solution in $O(n^2)$ time if there are n pins in this net.

C. Alpert and A. Devgan, "Wire Segmenting for Improved Buffer Insertion," *Proceedings of the ACM/IEEE Design Automation Conference*, pp. 588–593, 1997, hereby incorporated by reference, describes an algorithm for segmenting wires to increase the number of buffer insertion points available to a buffer insertion algorithm. If such a wire segmenting technique is used, n should be the number of candidate insertion points.

Algorithm Strategy

A common strategy to solve a sophisticated problem is divide-and-conquer, i.e., partitioning a complex problem into a set of subproblems in manageable scales. Such partitioning can be performed on either physical or design flow aspects. For example, a large net can be physically clustered into smaller nets as in the aforementioned C-Tree algorithm for computing a Steiner tree. Such partitioning not only speeds up the problem solving process, but also isolates subproblems according to their natures so that scattered targets can be avoided and the optimization can be well focused. Separating the Steiner tree construction from buffer insertion procedure is an example of partitioning the design flow. An initial Steiner tree construction can limit the buffer solution search along an anticipatedly good direction. A directional search is should be more efficient than the simultaneous routing and buffer insertion which is an implicitly brute-force search, even though the search may intelligently prune some unnecessary candidate solutions.

When considering how to incorporate blockage constraints, it is important to address the problem at an appropriate phase in the design flow. Blockage avoidance is more tied the generation of buffering solutions, i.e., it is hard to know how to make a Steiner tree avoid blockages without knowing where buffers are needed. A simultaneous approach is generally less efficient while separate routing and buffer insertion approach may not adequately plan for blockages. However, we can move the partitioning line to the middle of these two approaches, i.e., we can generate a Steiner tree which is allowed to be adjusted during buffer insertion construction according to dynamic requests for buffer blockage avoidance. Our key idea is to explore only a handful of alternative buffer insertion locations for which the tree topology can be modified (as opposed to an approach like buffered P-Tree, described in J. Lillis, C. K. Cheng, and T. Y. Lin, "Simultaneous routing and buffer insertion for high performance interconnect," *Proceedings of the Great Lake Symposium on VLSI*, pp. 148–153, 1996, which explores a much larger space). Exploring these alternative locations corresponds to moving a branch node outside a blockage which enables opportunities for decoupling and efficient driving of long paths.

Buffer blockages along paths that do not contain any Steiner nodes (i.e., nodes or branching points in the Steiner tree) can be mitigated relatively easily by allowing them to take multi-bend route without increasing wirelength. This type of solution can be achieved by applying the work in the incorporated C. J. Alpert, G. Gandham, J. Hu, J. L. Neves, S. T. Quay, and S. S. Sapatnekar, "Steiner Tree Optimization for Buffers, Blockages, and Bays," *IEEE Transactions on Computer-Aided Design*, vol. 20, no. 4, April 2001, pp. 556–562 to obtain a Steiner tree that has L-shapes and Z-bends that minimize overlap with blockages but no additional wirelength or tree topology adjustment. The difficult buffer blockage problems occur when a Steiner node lies on top of blockage which eliminates opportunities for decoupling non-critical paths and for driving long wires directly. We address this problem by generating alternative candidate solutions within van Ginneken's algorithm by trying an alternate location outside of blockage for the branching Steiner node.

The Basic RIATA Algorithm

Figure 4A:
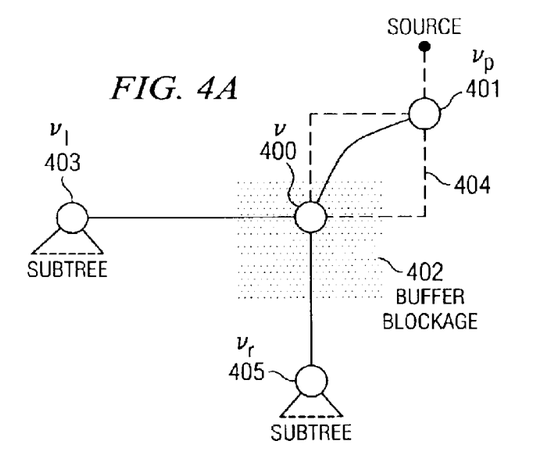
FIGS. 4A–4B are diagrams illustrating a solution to the buffer insertion problem in a Steiner tree with a single Steiner node overlapping a blockage, in accordance with a preferred embodiment of the present invention.
Figure 4B:
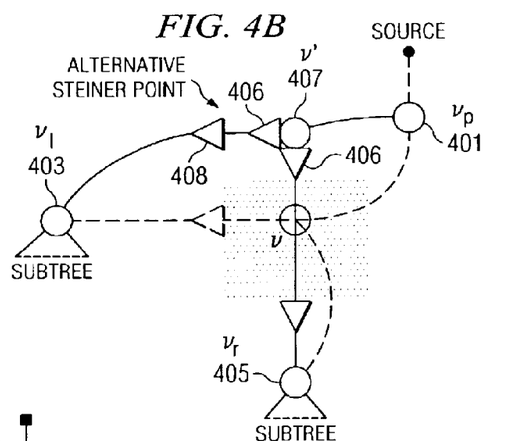

Given a Steiner tree, we extend the van Ginneken's algorithm so that the tree topology is adaptively adjusted during the bottom-up candidate solution propagation process, i.e., buffer insertion is not restricted to a fixed topology any more. During the bottom-up propagation process, if a Steiner point does not overlap a buffer blockage, our algorithm proceeds in the same way as the van Ginneken's algorithm. The difference occurs when a Steiner point 400 is within a buffer blockage 402, as depicted in FIG. 4A. To compensate for the inability to have possible buffer insertion candidates near blocked Steiner point 400, we seek alternative unblocked sites nearby to use instead. For the sake of simplicity, the alternative point is searched only between node v 400 and its parent node $v_p$ 401. Within bounding box 404 lying between nodes υ 400 and $v_p$ 401, we search for an unblocked point that is the closest to υ 400. Other searching schemes will be introduced in the next section. In our example, FIG. 4B shows the result of searching for the unblocked point υ' 407 (in FIG. 4B) closest to υ 400 on the path between υ 400 and its parent node $v_p$ 401. After we obtain alternative Steiner point 407, we may generate an alternative tree topology to allow buffer insertions, such as buffer insertions 406, at the adjusted branch node υ' 407.

Before we propagate the candidate solutions from the children nodes $v_l$ 403 and $v_r$ 405, we search for the least blocked path to their parent nodes υ 400 and υ' 407 through the technique presented in the incorporated C. J. Alpert, G. Gandham, J. Hu, J. L. Neves, S. T. Quay, and S. S. Sapatnekar, "Steiner Tree Optimization for Buffers, Blockages, and Bays," *IEEE Transactions on Computer-Aided Design*, vol. 20, no. 4, April 2001, pp. 556–562. By carefully choosing the cost, this technique can provide a path connecting a node a and another node b such that the path length is the shortest and the total path length overlapping with buffer blockages is minimized. We will hereafter refer to a subroutine LeastBlockedPath(a, b) to denote the application of this technique to find the least blocked path between child node b and parent node a, followed by an application of the wire segmenting algorithm described in the incorporated C. Alpert and A. Devgan, "Wire Segmenting for Improved Buffer Insertion," *Proceedings of the ACM/IEEE Design Automation Conference*, pp. 588–593, 1997. Thus, by calling LeastBlockedPath(υ, $v_l$), LeastBlockedPath(υ, $v_r$), LeastBlockedPath(υ', $v_l$), and LeastBlockedPath(υ', $v_r$), candidate solutions containing the least blocked paths between child nodes $v_l$ 403 and $v_r$ 405, and parent nodes υ 400 and υ' 407 may be derived.

Next, we propagate candidate solutions from $v_l$ 403 and $v_r$ 405 through the least blocked paths to both υ 400 and υ' 407. Note that during this propagation process, more candidate solutions may be generated by inserting buffers at segmenting points along the paths (e.g., buffer 408 in FIG. 4B) and at node υ' 407. Then, the candidate solutions at υ 400 and υ' 407 can be further propagated to their parent node $v_p$ 401 in the next stage. It is important to not that because the adjustment of the Steiner point's location is incorporated into mere candidate solutions, it only actually becomes part of the final Steiner tree if the final solution is generated by incorporating candidate solutions that contain the adjusted Steiner point location. Performing the construction in this manner guarantees that our approach will perform at least as well as the original van Ginneken algorithm. Since the alternative Steiner points are searched along a constructed Steiner tree, the solution space is limited compared with the simultaneous approach. We call this basic algorithm "RIATA," which stands for "Repeater Insertion with Adaptive Tree Adjustment."

The Enhanced Algorithm (RIATA+)

Figure 5A:
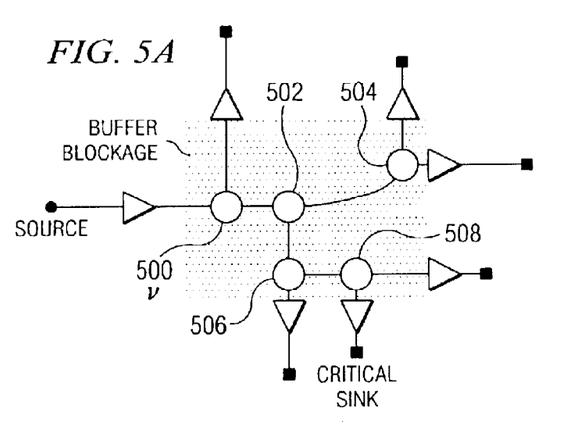
FIGS. 5A–5C are diagrams illustrating solutions to the buffer insertion problem in a Steiner tree with a multiple Steiner nodes overlapping a blockage, in accordance with a preferred embodiment of the present invention.
Figure 5B:
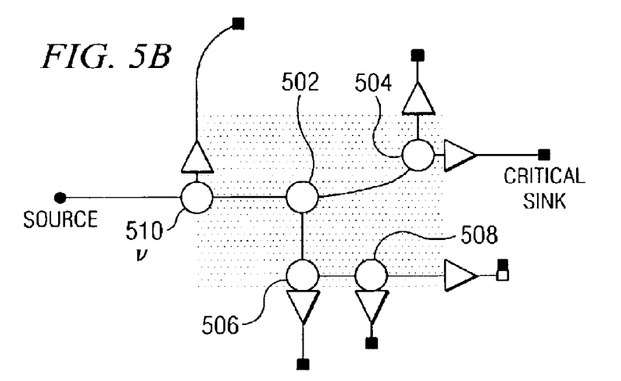
Figure 5C:
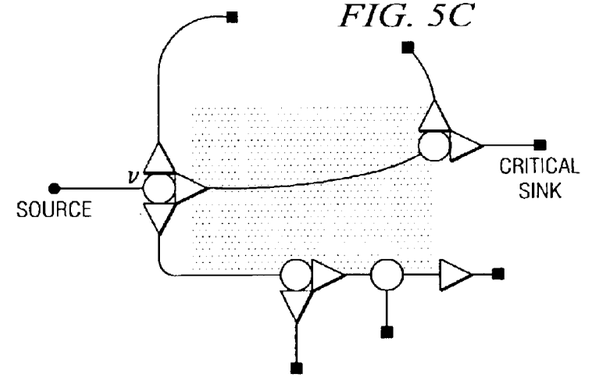

In previous section, we introduced the basic RIATA algorithm in which only one alternative point is searched for each Steiner node between itself and its parent node. When a Steiner node and its parent node are both in the same blockage, no alternative point will be found. This is illustrated in the example in FIG. 5A, where five Steiner nodes 500–508 are within the same blockage. If we apply the basic RIATA technique, we can find the alternative Steiner point for only Steiner node υ 500 in FIG. 5A (the alternative unblocked node υ' 510 is shown in FIG. 5B). In order to allow unblocked alternative points for other Steiner nodes in this difficult case (e.g., to obtain a solution such as depicted in FIG. 5C), we need to expand the search range.

Figure 6A:
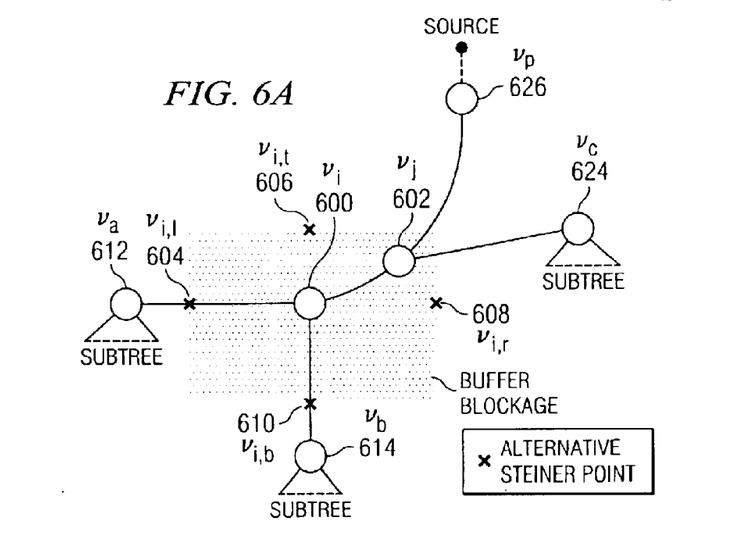
FIGS. 6A–6C are diagrams illustrating solutions to the buffer insertion problem in a Steiner tree with a multiple Steiner nodes overlapping a blockage, in accordance with a preferred embodiment of the present invention.
Figure 6B:
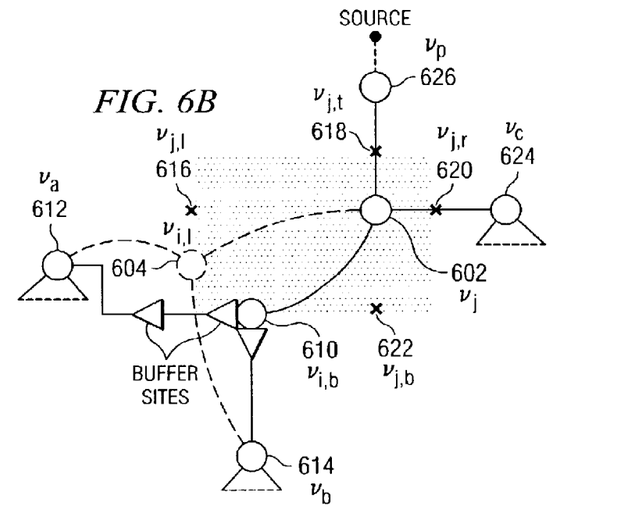
Figure 6C:
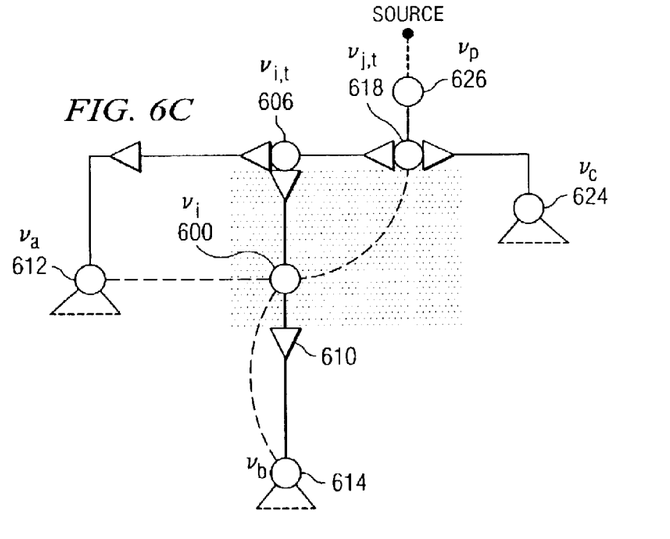

We illustrate this enhanced search scheme through the example in FIGS. 6A–6C. FIG. 6A shows that there are two neighboring Steiner node $v_i$ 600 and $v_j$ 602 in the same buffer blockage. When van Ginneken's algorithm proceeds to node $v_i$ 600, we consider four alternative points on each side of the blockage. They are the four crosses denoted $v_{i,l}$ 604, $v_{i,t}$ 606, $v_{i,r}$ 608, and $v_{i,b}$ 610 in FIG. 6A. We define the expanded Steiner node set $\tilde{V}(v_i)$ associated with $v_i$ 600 as $\tilde{V}(v_i) = \{v_i, v_{i,l}, v_{i,t}, v_{i,r}, v_{i,b}\}$ (Note: If $v_i$ is not a Steiner node or it is not in any blockages, $\tilde{V}(v_i) = \{v_i\}$). Similar to the basic RIATA algorithm, the candidate solutions at children node $v_a$ 612 and $v_b$ 614 are propagated to every Steiner point $v \in \tilde{V}(v_i)$ and are merged there.

If parent node $v_j$ 602 of $v_i$ 600 is a Steiner node in a blockage as in FIGS. 6A–6C, an expanded Steiner node set $\tilde{V}(v_j)$ (nodes 616–622) is generated as in FIG. 6B, and candidate solutions are propagated from each node in $\tilde{V}(v_i)$ to each node in $\tilde{V}(v_j)$. Since the candidate solutions at $\tilde{V}(v_i)$ will be propagated from five different points to five other different nodes in $\tilde{V}(v_j)$, there will be 25 combinations. However, if one of the combinations causes a path detour, the resulting solutions are generally inferior to those without path detours. For example, if we propagate candidate solutions from $v_{i,t}$ 606 to $v_{j,b}$ 622, a large path detour will be incurred. This observation tells us that certain combinations can be pruned out without significantly affecting the solution quality. In order to specify the pruning scheme, we define the nearest unblocked ancestor of a node as the first unblocked node encountered when we trace from this node upstream toward the source. For a child Steiner node $v_i$ (e.g., Steiner node $v_i$ 600) at location $(x_i, y_i)$ and its parent node $v_j$ (e.g., parent node $v_j$ 602) at location $(x_j, y_j)$, both of which are overlapped with blockages, with the nearest unblocked ancestor of $v_j$ is node $v_c$ 624 at $(x_c, y_c)$. We call the propagation from $v_i$ to $v_j$ monotone if $x_j = \text{median}(x_i, x_j, x_c)$ and $y_i = \text{median}(y_i, y_j, y_c)$. We do not simply choose $v_j$'s intermediate parent node $v_p$ 626 as reference point, because $v_p$ 626 may be in a blockage and its alternative point may invalidate the monotone property defined at $v_p$ 626 itself. In FIG. 4A, for example, the nearest unblocked ancestor of $v$ 400 is coincidentally the same as $v_p$ 401.

In a preferred embodiment, the pruning scheme is defined by the following rules: (1) when we propagate candidate solutions from each node of $\tilde{V}(v_i)$ to each node of $\tilde{V}(v_j)$, any monotone propagation is allowed; (2) propagation from $v_i$ to any node in $\tilde{V}(v_j)$ is always allowed in order to ensure there is at least one set of solutions propagated to every node in $\tilde{V}(v_j)$; and (3) any non-monotone propagation from a node other than $v_i$ is disallowed. For the example depicted in FIG. 6C, candidate solutions propagating from $v_{i,t}$ to $v_j$ are disallowed. Monotone propagations from $v_{i,t}$ to $v_{j,t}$ and from $v_i$ to $v_{j,t}$ are allowed and illustrated in FIG. 6C. Note that the candidate solutions from $v_a$ 612 in FIGS. 6A–6C may come from an expanded Steiner node set $\tilde{V}(v_a)$ as well, and similarly, any non-monotone propagation from a node in $\tilde{V}(v_a)$, except from $v_a$ to $\tilde{V}(v_i)$, is prohibited.

Searching alternative Steiner points on four boundaries of the blockage guarantees that alternative points can always be found unless the whole chip area is blocked. Furthermore, this search scheme allows Steiner nodes to be spread out around the blockage if there are multiple Steiner nodes in the same blockage as shown in FIG. 6C. If we consider only one alternative point for each Steiner node, the alternative Steiner nodes may be crowded on single side of the blockage. We allow candidate solutions from $v_i$ to be propagated to every node in $\tilde{V}(v_j)$ in FIGS. 6A–6C for the same reason.

To implement this heuristic we need to efficiently find the closest unblocked node set $\tilde{V}(v)$ for a node $v$. Given a node $v$ and a set of rectangles $R = \{r_1, r_2, \ldots, r_k\}$ representing the buffer blockages, if node $v$ is within a blockage $r \in R$, we need to find the unblocked points which is the closest to $v$ on each boundary of $r$. If there is no overlap between any two buffer blockages, all we need to do is to locate the rectangle $r$ that overlaps $v$. If $r$ is defined by bounding coordinates $(x_{lo}, y_{lo}, x_{hi}, y_{hi})$ and $v$ is located at point $(x_v, y_v)$, the unblocked points closest to $v$ on each boundary of $r$ are $(x_{lo}, y_v)$, $(x_v, y_{hi})$, $(x_{hi}, y_v)$ and $(x_v, y_{lo})$. If the set of rectangles $R$ is stored as an interval tree, the desired rectangle $r$ can be found in $O(k)$ time in the worst case. Interval trees are described in T. H. Cormen, C. E. Leiserson, R. L. Rivest, and C. Stein, *Introduction to Algorithms*, 2d. Ed., MIT Press, 2001, pp. 311–316, which is hereby incorporated by reference.

We let UnblockedNodes($v$,R) denote a procedure that finds such an unblocked node set.

Figure 7:
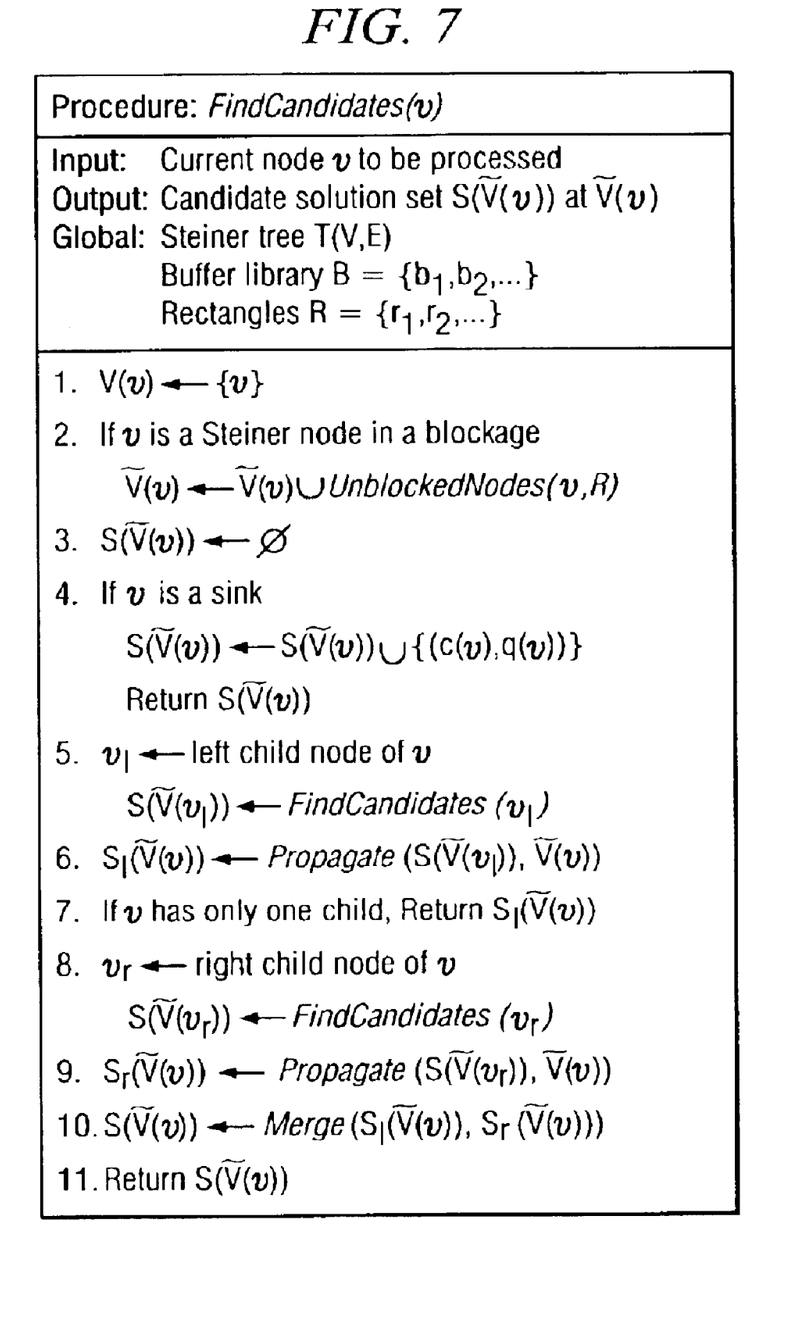
FIG. 7 is a pseudo-code representation of a process for finding inserting buffers in a routing tree with blockages in accordance with a preferred embodiment of the present invention.
Figure 8:
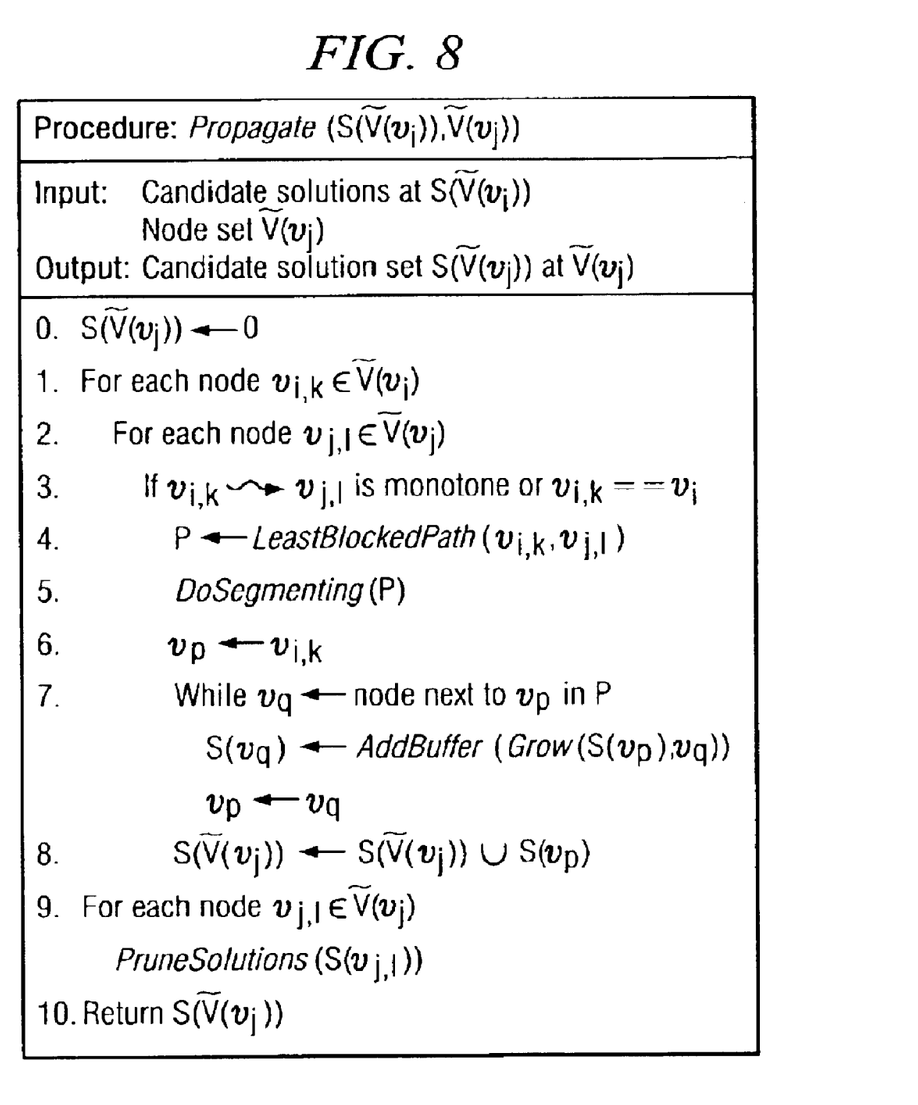
FIG. 8 is a pseudo-code representation of a subroutine for propagating solutions associated with a first node set to a second node set in accordance with a preferred embodiment of the present invention.

We call this enhanced algorithm "RIATA+." A preferred embodiment of the RIATA+ algorithm is described in FIG. 7 in the form of a recursive procedure called "FindCandidates," which takes a current node $v$ as input and assumes the existence of a Steiner tree T(V,E), buffer library B = $\{b_1, b_2, \ldots\}$, and set of blockage rectangles R = $\{r_1, r_2, \ldots\}$ as global values (constants or variables). FindCandidates returns a candidate solution set $S(\tilde{V}(v))$ as output, which consists of a number of capacitance/required arrival time pairs. Because FindCandidates progresses in a top-down fashion, to find a solution one calls FindCandidates with the source node as the input $v$. FindCandidates makes use of a subroutine Propagate to propagate candidate solutions from one node set to another. Pseudo-code for the Propagate subroutine is shown in FIG. 8 and will be described shortly.

Turning now to the pseudo-code description provided in FIG. 7, the algorithm (RIATA+) begins on the depicted line 1 by adding the current node $v$ to the set $\tilde{V}(v)$. On line 2, if the current node $v$ is a Steiner node, the unblocked candidate node set UnblockedNodes($v$,R) is added to $\tilde{V}(v)$. Next, on line 3, the candidate solution set $S(\tilde{V}(v))$ for $\tilde{V}(v)$ is set to the empty set ($\emptyset$).

On line 4, if the current node $v$ is a sink (i.e., a leaf node of the Steiner tree), then capacitance c($v$) and required arrival time q($v$) for the sink are returned as a solution. On line 5, since the current node $v$ is not a sink, it has at least one child (i.e., the left child of $v$). FindCandidates is then called recursively to find a candidate solution set for the left child node $v_l$. On line 6, the Propagate subroutine is called to propagate the solution set $S(\tilde{V}(v_l))$ for the candidate node set $\tilde{V}(v_l)$ for the left child node $v_l$ to the candidate node set $\tilde{V}(v_l)$ for the current node $v$ to obtain a new solution set $S_l(\tilde{V}(v))$. If, on line 7, $v$ only has a left child, the solution set $S_l(\tilde{V}(v))$ is returned as the solution for $v$.

If $v$ has two children, however (since a binary Steiner tree is assumed), FindCandidates is called recursively on line 8 to find a solution set $S(\tilde{V}(v_r))$ for the right child node $v_r$. On line 9, this solution set $S_r(\tilde{V}(v_r))$ is propagated to the current candidate node set $\tilde{V}(v)$ using the Propagate subroutine to obtain a new solution set $S_r(\tilde{V}(v))$. The solution sets $S_l(\tilde{V}(v))$ and $S_r(\tilde{V}(v))$ are then merged on line 10 using the Merge operation previously described in conjunction with van Ginneken's algorithm to obtain a solution set $S(\tilde{V}(v))$ for the current node $v$. Finally, on line 11, this solution set $S(\tilde{V}(v))$ is returned.

FIG. 8 is a diagram providing pseudo code for the Propagate subroutine referred to in FIG. 7, in accordance with a preferred embodiment of the present invention. Propagate takes as input a set of candidate solutions $S(\tilde{V}(v_i))$ for a node set $\tilde{V}(v_i)$ and a second node set $\tilde{V}(v_j)$. Propagate returns a candidate solution set $S(\tilde{V}(v_j))$ for the node set $\tilde{V}(v_j)$.

On line 0, the routine starts by setting the solution set $S(\tilde{V}(v_j))$ to the empty set ($\emptyset$). Lines 1 and 2 establish a doubly nested loop iterating over the Cartesian product of the node sets ($\tilde{V}(v_i) \times \tilde{V}(v_j)$). In other words, the doubly nested loop established by lines 1 and 2 iterates over all pairings of an element from $\tilde{V}(v_i)$ with an element from $\tilde{V}(v_j)$. Each iteration, the element from $\tilde{V}(v_i)$ is denoted $v_{i,k}$ and the element from $\tilde{V}(v_j)$ is denoted $v_{j,l}$.

Line 3 states that at each iteration of the loop, a determination is made as to whether a propagation from $v_{i,k}$ to $v_{j,l}$ (written as $v_{i,k} \leadsto v_{j,l}$) is monotone, according to previously stated definition, or if $v_{i,k}$ is the same node as $v_i$. If either of these condition is true, then lines 4–8 are executed. Otherwise, the loop cycles through another iteration.

Line 4 calls the aforementioned LeastBlockedPath routine to calculate the least blocked path P from $v_{i,k}$ to $v_{j,l}$ according to the algorithm described in the incorporated C. J. Alpert, G. Gandham, J. Hu, J. L. Neves, S. T. Quay, and S. S. Sapatnekar, "Steiner Tree Optimization for Buffers, Blockages, and Bays," *IEEE Transactions on Computer-Aided Design*, vol. 20, no. 4, April 2001, pp. 556–562. On line 5, the path P is segmented according to the algorithm described in the incorporated C. Alpert and A. Devgan, "Wire Segmenting for Improved Buffer Insertion," *Proceedings of the ACM/IEEE Design Automation Conference*, pp. 588–593, 1997. On line 6, a variable called $v_p$ is set to the value of $v_{i,k}$.

At line 7, a loop is executed that generates a number of candidate solutions, each representing a buffer insertion at a different position (i.e., at a different segment) along the segmented path P. Each of these candidate solutions is added to the final solution set $S(\tilde{V}(v_j))$ on line 8.

Line 9, which is executed after the doubly nested loop terminates, prunes any inferior solutions from $S(\tilde{V}(v_j))$. Finally, on line 10, the solution set $S(\tilde{V}(v_j))$ is returned.

The RIATA+ algorithm is actually a generalization of the basic RIATA algorithm: If we define $\tilde{V}(v_i)$ to include only $v_i$ and its nearest unblocked point between $v_i$ and its parent $v_j$, we obtain the basic RIATA algorithm. One of ordinary skill in the art will recognize that by varying the definition of $\tilde{V}(v_i)$, many variations on the general RIATA+ algorithm are possible without departing from the scope and spirit of the present invention, each with varying levels of solution quality and runtime performance. For example, one can include more alternative Steiner points in $\tilde{V}(v_i)$ or even allow non-monotone propagations when the net is extremely timing-critical or its size is small.

Complexity

Given a net with n insertion points and m pins, a buffer library B and k rectangles representing blockages, if the maximal candidate solution set size is g and the maximal expanded Steiner node set size is h, then the complexity of our heuristic is $O(g \cdot n \cdot |B| \cdot h^2 + m \cdot k)$. The term of $m \cdot k$ comes from the operations of searching unblocked alternative Steiner points. The values for the constant h are 2 for the RIATA heuristic and 5 for the RIATA+ heuristic. We may assume that the capacitance value in each candidate solution can take only a polynomially bounded integer, thus the complexity of our heuristic is pseudo-polynomial.

Flowchart

Figure 9:
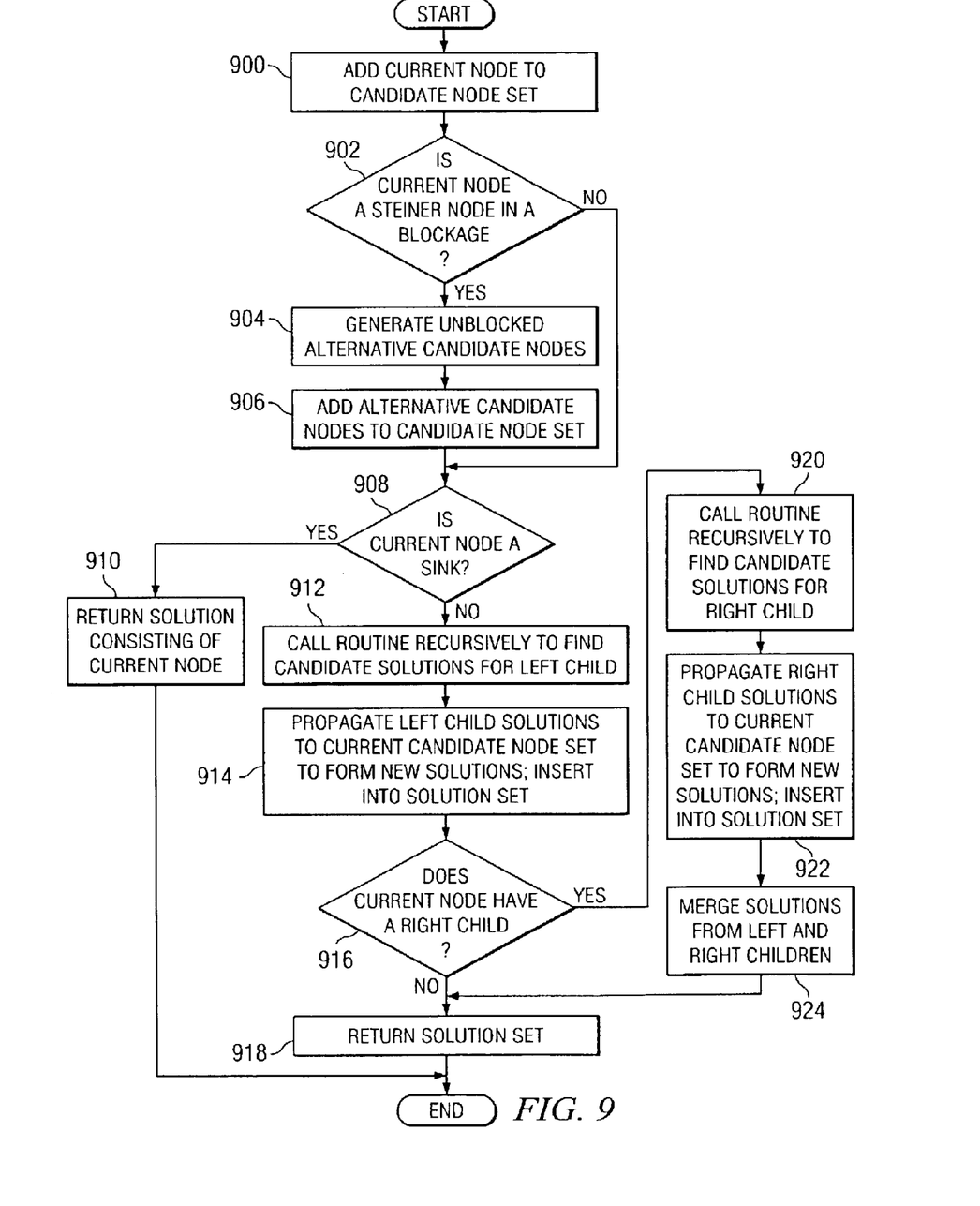
FIG. 9 is a flowchart representation of a process for inserting buffers in a routing tree in accordance with a preferred embodiment of the present invention.

FIG. 9 is a flowchart representation of a process for buffer insertion in accordance with a preferred embodiment of the present invention. This high-level flowchart diagram is representative of both the basic RIATA algorithm and the enhanced RIATA+ algorithm. The process begins in block 900, where the current node in the Steiner tree (the routine is intended to be initially called with the source or root of the tree as the current node) is added to a current candidate node set. If the current node is a Steiner node that overlaps a blockage (block 902: Yes), then a set of unblocked alternative candidate nodes is generated (block 904). These alternative candidates are then added to the candidate node set (block 906). The process then proceeds to block 908, or if the current node was not a Steiner node in a blockage (block 902: No), the process proceeds directly to block 908.

If the current node is a sink (block 908: Yes), then a solution is returned consisting of the capacitance and required arrival time for the current node (block 910). If not (block 908: No), then the routine in FIG. 9 is called recursively to find a candidate solution set for the left child of the current node (block 912). These left-child solutions are then propagated to the nodes in the current candidate node set to form a new set of solutions (block 914).

A determination is then made as to whether the current node has a right child in addition to a left child (block 916). If not (block 916: No), the solution set created in block 914 is simply returned (block 918). If so (block 916: Yes), however, the routine in FIG. 9 is called recursively to find a candidate solution set for the right child of the current node (block 920). These right-child solutions are then propagated to the nodes in the current candidate node set to form a new set of solutions (block 922). The solutions generating in block 914 and block 922 are then merged to develop candidate solutions taking into account the both branches of the Steiner tree emanating from the present node (block 924). This set of merged solutions is then returned as the final solution set (step 918).

It is important to note that while the present invention has been described in the context of a fully functioning data processing system, those of ordinary skill in the art will appreciate that the processes of the present invention are capable of being distributed in the form of a computer readable medium of instructions or other functional descriptive material and in a variety of other forms and that the present invention is equally applicable regardless of the particular type of signal bearing media actually used to carry out the distribution. Examples of computer readable media include recordable-type media, such as a floppy disk, a hard disk drive, a RAM, CD-ROMs, DVD-ROMS, and transmission-type media, such as digital and analog communications links, wired or wireless communications links using transmission forms, such as, for example, radio frequency and light wave transmissions. The computer readable media may take the form of coded formats that are decoded for actual use in a particular data processing system. Functional descriptive material is information that imparts functionality to a machine. Functional descriptive material includes, but is not limited to, computer programs, instructions, rules, facts, definitions of computable functions, objects, and data structures.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method in a data processing system for inserting buffers in a routing tree that overlaps a blockage, the method comprising:

determining whether a selected node in the routing tree overlaps the blockage;

in response to a determination that the selected node overlaps the blockage, generating an alternative candidate node on each boundary of the blockage, wherein the alternative candidate node is a node on the boundary edge of the blockage that is unblocked and closest to the selected node that overlaps the blockage from that boundary; and in response to generating the alternative candidate nodes, generating at least one candidate buffer insertion solution in which one of the alternative candidate nodes is substituted for the selected node in the routing tree.

2. The method of claim 1, wherein the routing tree is a Steiner tree.

3. The method of claim 1, wherein the alternative candidate node includes an unblocked node.

4. The method of claim 3, wherein the unblocked node is located on an edge of the blockage.

5. The method of claim 1, further comprising:
determining whether the selected node is associated with at least one child;

in response to a determination that the selected node is associated with at least one child, generating a set of candidate buffer solutions associated with at least one child;

in response to generating the set of candidate buffer solutions associated with at least one child, propagating the set of candidate buffer solutions to the alternative candidate node to form the at least one candidate buffer insertion solution.

6. The method of claim 5, wherein propagating the set of candidate buffer solutions to the alternative candidate node includes:
generating a candidate buffer insertion solution that includes a connection between a first node in one of the candidate buffer solutions associated with at least one child and a second node from at least one alternative candidate node.

7. The method of claim 6, further comprising:
performing wire segmenting on the connection; and
generating candidate buffer insertion solutions that include buffers inserted at locations along the connection, wherein the locations are defined by the wire segmenting.

8. The method of claim 6, further comprising:
computing a least blocked path for the connection; and
generating the candidate buffer insertion solution that includes the connection in accordance with the least blocked path for the connection.

9. The method of claim 1, further comprising:
generating a bounding box between an unblocked parent node and the selected node that overlaps the blockage, where in the unblocked parent node and the selected node that overlaps the blockage are at opposite corners of the bounding box and wherein a search for the alternative candidate node is performed within an area defined by the bounding box.

10. A computer program product in at least one computer-readable medium for inserting buffers in a routing tree that overlaps a blockage, the computer program product comprising functional descriptive material that, when executed by a computer, enables the computer to perform acts including:
determining whether a selected node in the routing tree overlaps the blockage;

in response to a determination that the selected node overlaps the blockage, generating an alternative candidate node on each boundary of the blockage, wherein the alternative candidate node is a node on the boundary edge of the blockage that is unblocked and closest to the selected node that overlaps the blockage from that boundary; and in response to generating the alternative candidate nodes, generating at least one candidate buffer insertion solution in which one of the alternative candidate nodes is substituted for the selected node in the routing tree.

11. The computer program product of claim 10, wherein the routing tree is a Steiner tree.

12. The computer program product of claim 10, wherein the alternative candidate node includes an unblocked node.

13. The computer program product of claim 12, wherein the unblocked node is located on an edge of the blockage.

14. The computer program product of claim 10, comprising additional functional descriptive material that, when executed by the computer, enables the computer to perform additional acts including:
determining whether the selected node is associated with at least one child;

in response to a determination that the selected node is associated with at least one child, generating a set of candidate buffer solutions associated with at least one child;

in response to generating the set of candidate buffer solutions associated with the at least one child, propagating the set of candidate buffer solutions to the alternative candidate node to form at least one candidate buffer insertion solution.

15. The computer program product of claim 14, wherein propagating the set of candidate buffer solutions to the alternative candidate node includes:
generating a candidate buffer insertion solution that includes a connection between a first node in one of the candidate buffer solutions associated with at least one child and a second node from at least one alternative candidate node.

16. The computer program product of claim 15, comprising additional functional descriptive material that, when executed by the computer, enables the computer to perform additional acts including:
performing wire segmenting on the connection; and
generating candidate buffer insertion solutions that include buffers inserted at locations along the connection, wherein the locations are defined by the wire segmenting.

17. The computer program product of 15, comprising additional functional descriptive material that, when executed by the computer, enables the computer to perform additional acts including:
computing a least blocked path for the connection; and
generating the candidate buffer insertion solution that includes the connection in accordance with the least blocked path for the connection.

18. The computer program product of claim 10, comprising additional functional descriptive material that, when executed by the computer, enables the computer to perform additional acts including:
generating a bounding box between an unblocked parent node and the selected node that overlaps the blockage, where in the unblocked parent node and the selected node that overlaps the blockage are at opposite corners of the bounding box and wherein a search for the alternative candidate node is performed within an area defined by the bounding box.

19. A data processing system for inserting buffers in a routing tree that overlaps a blockage, the data processing system comprising:

means for determining whether a selected node in the routing tree overlaps the blockage;

means, responsive to a determination that the selected node overlaps the blockage, for generating an alternative candidate node on each boundary of the blockage, wherein the alternative candidate node is a node on the boundary edge of the blockage that is unblocked and closest to the selected node that overlaps the blockage from that boundary; and means, responsive to generating the alternative candidate nodes, for generating at least one candidate buffer insertion solution in which one of the alternative candidate nodes is substituted for the selected node in the routing tree.

20. The data processing system of claim 19, wherein the routing tree is a Steiner tree.

21. The data processing system of claim 19, wherein the alternative candidate node includes an unblocked node.

22. The data processing system of claim 21, wherein the unblocked node is located on an edge of the blockage.

23. The data processing system of claim 19, further comprising:

means for determining whether the selected node is associated with at least one child;

means, responsive to a determination that the selected node is associated with at least one child, for generating a set of candidate buffer solutions associated with at least one child;

means, responsive to generating the set of candidate buffer solutions associated with at least one child, for propagating the set of candidate buffer solutions to the alternative candidate node to form the at least one candidate buffer insertion solution.

24. The data processing system of claim 23, wherein propagating the set of candidate buffer solutions to the alternative candidate node includes:

generating a candidate buffer insertion solution that includes a connection between a first node in one of the candidate buffer solutions associated with at least one child and a second node from at least one alternative candidate node.

25. The data processing system of claim 24, further comprising:

means for performing wire segmenting on the connection; and means for generating candidate buffer insertion solutions that include buffers inserted at locations along the connection, wherein the locations are defined by the wire segmenting.

26. The data processing system of claim 24, further comprising:

means for computing a least blocked path for the connection; and means for generating the candidate buffer insertion solution that includes the connection in accordance with the least blocked path for the connection.

27. The data processing system of claim 19, further comprising:

means for generating a bounding box between an unblocked parent node and the selected node that overlaps the blockage, where in the unblocked parent node and the selected node that overlaps the blockage are at opposite corners of the bounding box and wherein a search for the alternative candidate node is performed within an area defined by the bounding box.

* * * * *